(12) United States Patent
Hente

(10) Patent No.: US 9,713,224 B2
(45) Date of Patent: Jul. 18, 2017

(54) ELECTROLUMINESCENT DEVICE WITH SHORT DETECTION CIRCUIT

(71) Applicant: KONINKLIJKE PHILIPS N.V., Eindhoven (NL)

(72) Inventor: Dirk Hente, Wuerselen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/114,877

(22) PCT Filed: Jan. 13, 2015

(86) PCT No.: PCT/EP2015/050437
§ 371 (c)(1),
(2) Date: Jul. 28, 2016

(87) PCT Pub. No.: WO2015/113805
PCT Pub. Date: Aug. 6, 2015

(65) Prior Publication Data
US 2016/0353546 A1    Dec. 1, 2016

(30) Foreign Application Priority Data

Jan. 28, 2014  (EP) .................................. 14152787

(51) Int. Cl.
*H05B 33/08*      (2006.01)
*G01R 31/26*      (2014.01)

(52) U.S. Cl.
CPC ....... *H05B 33/0887* (2013.01); *H05B 33/083* (2013.01); *H05B 33/0815* (2013.01);
(Continued)

(58) Field of Classification Search
CPC ............ H05B 33/0887; H05B 33/0815; H05B 33/0896; H05B 33/0845; H05B 33/083
(Continued)

(56) References Cited

U.S. PATENT DOCUMENTS

| 5,896,084 A | 4/1999 | Weiss et al. |
| 2006/0170287 A1 | 8/2006 | Ito et al. |

(Continued)

FOREIGN PATENT DOCUMENTS

| DE | 19734750 A1 | 2/1999 |
| DE | 102008008217 A1 | 8/2008 |

(Continued)

*Primary Examiner* — Douglas W Owens
*Assistant Examiner* — Wei Chan

(57) ABSTRACT

The present invention relates to an electroluminescent device (20) with a light-emitting element (21) having a capacitance, a switchable current source (22) being connected to the light-emitting element for providing a driving current to the light-emitting element, and a short detection circuit (23) for detecting a short in the light-emitting element. The short detection circuit comprises a triggerable voltage determining unit (24) for determining, upon being triggered, a voltage across the light-emitting element, a triggering unit (25) for triggering the triggerable voltage determining unit to determine the voltage across the light-emitting element after a time period (At) during which the driving current is not provided to the light-emitting element, and a short detection unit (26) for detecting a short in the light-emitting element based on the determined voltage across the light-emitting element. Therewith, the detection can be less sensitive with respect to production tolerances and the like.

14 Claims, 9 Drawing Sheets

(52) U.S. Cl.
CPC ..... *H05B 33/0845* (2013.01); *H05B 33/0893* (2013.01); *H05B 33/0896* (2013.01); *G01R 31/2635* (2013.01)

(58) Field of Classification Search
USPC ....... 315/291, 224, 307, 201, 193, 297, 122, 315/210, 294, 200 R, 226
See application file for complete search history.

(56) References Cited

U.S. PATENT DOCUMENTS

| | | |
|---|---|---|
| 2007/0159750 A1* | 7/2007 | Peker ................ H05B 33/0869 361/93.1 |
| 2007/0205793 A1 | 9/2007 | Wang |
| 2008/0231198 A1 | 9/2008 | Zarr |
| 2010/0085074 A1 | 4/2010 | Yinn et al. |
| 2010/0156324 A1 | 6/2010 | Nagase et al. |
| 2013/0049599 A1* | 2/2013 | Logiudice ............ H05B 33/083 315/122 |
| 2014/0028205 A1* | 1/2014 | Lischka ............. H05B 33/0845 315/193 |
| 2014/0160609 A1* | 6/2014 | Chen ....................... H02H 3/20 361/86 |
| 2014/0327359 A1 | 11/2014 | Masazumi et al. |

FOREIGN PATENT DOCUMENTS

| | | |
|---|---|---|
| EP | 2549835 A2 | 1/2013 |
| JP | H07140490 A | 6/1995 |
| JP | 2008251276 A | 10/2008 |
| JP | 2009038247 A | 2/2009 |
| WO | 2013001756 A1 | 1/2013 |
| WO | 2013080689 A1 | 6/2013 |

\* cited by examiner

ELECTROLUMINESCENT DEVICE WITH SHORT DETECTION CIRCUIT

CROSS-REFERENCE TO PRIOR APPLICATIONS

This application is the U.S. National Phase application under 35 U.S.C. §371 of International Application No. PCT/EP2015/050437, filed on Jan. 13, 2015, which claims the benefit of European Patent Application No. 14152787.9, filed on Jan. 28, 2014. These applications are hereby incorporated by reference herein.

FIELD OF THE INVENTION

The present invention relates to an electroluminescent device comprising a light-emitting element having a capacitance, a switchable current source for providing a driving current to the light-emitting element, and a short detection circuit for detection a short in the light-emitting element. Further, the present invention relates to a corresponding short detection method for detecting a short in a light-emitting element.

BACKGROUND OF THE INVENTION

Light-emitting diodes (LEDs) and organic light-emitting diodes (OLEDs), in particular, large area LEDs/OLEDs, are prone to shorts due to small particles contaminating the LED/OLED substrate and/or layers in case of imperfect cleaning and handling during production. Since, in practice, not all defects can be detected in the final production quality control, the occurrence of small shorts during operation may not always be avoided.

The detection of such shorts in the light-emitting area of e.g. an OLED is important, because they may result in a significant increase in the temperature at the locations of the defects (known also as "hot spot" effects). This is due to the fact that the power distribution, which is substantially evenly distributed across the light-emitting area during normal operation, may be concentrated at a very small area in case of a short. The local temperature at a hot spot can easily reach values well above 100 degrees Celsius, which can damage the OLED and/or can even be dangerous to a human being.

Prior art methods for short detection are based on monitoring the LED/OLED voltage as an indicator for the presence of a short. For example, if the LED/OLED forward voltage falls below a predefined voltage threshold for a nominal constant driving current, the LED/OLED may be considered to be defective. This detection is dependent on a characteristic absolute voltage threshold that is rather sensitive with respect to production tolerances (resp. LED/OLED "binning") and the corresponding LED/OLED (forward) voltage variants resulting therefrom as well as the environment temperature.

US-2008/0231198 discloses a circuit for controlling a current through an LED. The circuit includes a regulator for providing the current to the LED, a voltage monitoring circuit for monitoring a voltage drop across the LED and for providing a voltage reading signal based on the voltage drop, and a data converter logic circuit coupled with the regulator and the voltage monitoring circuit. The data converter logic circuit is arranged to control the regulator to adjust the current based on the signal, as well as being operable to detect a short-circuit of the LED based on a sudden drop in voltage.

SUMMARY OF THE INVENTION

It is an object of the present invention to provide an electroluminescent device comprising a light-emitting element having a capacitance, a switchable current source for providing a driving current to the light-emitting element, and a short detection circuit for detecting a short in the light-emitting element, wherein the short detection can be less sensitive with respect to production tolerances and the like. It is a further object of the present invention to provide a corresponding short detection circuit and a corresponding short detection method for detecting a short in a light-emitting element.

In a first aspect of the present invention, an electroluminescent device is presented, wherein the electroluminescent device comprises:

a light-emitting element having a capacitance, a switchable current source being connected to the light-emitting element for providing a driving current to the light-emitting element, and a short detection circuit for detecting a short in the light-emitting element, wherein the short detection circuit comprises:

a triggerable voltage determining unit for determining, upon being triggered, a voltage across the light-emitting element, a triggering unit for triggering the triggerable voltage determining unit to determine the voltage across the light-emitting element after a time period during which the driving current is not provided to the light-emitting element, and a short detection unit for detecting a short in the light-emitting element based on the determined voltage across the light-emitting element.

The present invention is based on the insight of the present inventor that for a prestine light-emitting element having a capacitance, the voltage across the light-emitting element drops only very slowly from its forward voltage after a connected current source is turned off, i.e., after the light-emitting element is not provided with a driving current any more. This is due to the capacitance, which is charged during normal operation of the light-emitting element and which is only very slowly discharged by leakage effects when the driving current is turned off. In contrast, the behaviour of the light-emitting element is very different in the case of a short occurring therein. Once the connected current source is turned off, the voltage across the light-emitting element drops very fast towards 0V, because the capacitance is rapidly discharged due to the presence of the short. Since the short detection circuit comprises a triggerable voltage determining unit for determining, upon being triggered, a voltage across the light-emitting element, and a triggering unit for triggering the triggerable voltage determining unit to determine the voltage across the light-emitting element after a time period during which the driving current is not provided to the light-emitting element, this difference in the discharge behaviour of a prestine vs. a defective light-emitting element, which involves very different time constants, can be used for detecting a short in the light-emitting element. This has the advantage that the detection can be independent of a characteristic absolute voltage threshold that is rather sensitive with respect to production tolerances resp. binning as well as the environment temperature. Moreover, it can more easily be combined with pulse width modulation (PWM) dimming and amplitude modulation (AM) dimming.

As is understood by a person skilled in the art, the term "short" indicates a condition in which the light-emitting element has an abnormally low impedance at a certain location. Such a short may occur during operation due to, e.g., defects caused by contaminations of the substrate and/or layers of the light-emitting element resulting from an imperfect cleaning and handling production. For OLEDs, the short may result in a significant increase in the temperature at the location of the defect (known also as "hot spot" effect). For LEDs, which are today used in various applications, such as automotive, it is also desirable to monitor the status of individual LEDs of, e.g., a car backlight, and, in case of a short, to indicate the defect.

It is preferred that the light-emitting element comprises an organic light-emitting diode (OLED), wherein the capacitance comprises an internal capacitance of the OLED, or, that the light-emitting element comprises a light-emitting diode (LED), wherein the capacitance comprises an external capacitance being connected in parallel to the LED. It is, of course, also possible that an additional external capacitance is added to an OLED. In this case, the capacitance can be realized by the combination of the internal capacitance of the OLED and the external capacitance that is added to the OLED. Moreover, typical LEDs also have at least a small internal capacitance that adds to the connected external capacitance to realize the capacitance.

It is further preferred that the time period is shorter than a discharge time required for the capacitance to become discharged when the driving current is not provided to the light-emitting element in case there is no short in the light-emitting element.

By choosing the time period, during which the driving current is not provided to the light-emitting element and after which the voltage across the light-emitting element is determined by the voltage determining unit upon being triggered by the triggering unit, in the above manner, the difference in the discharge behaviour of a prestine vs. a defective light-emitting element (cf. above) can robustly be realized for the short detection.

The discharge time of the capacitance comprised by a prestine light-emitting element may approximately be determined as a time constant $\tau 1$, which is the product of the effective capacitance Cd (including any additional external capacitances that may be added) across the terminals of the light-emitting element and its equivalent dynamic resistance Rd corresponding to the slope of the IV-curve (cf. also FIG. 1 below) at the (constant) driving current Id: $\tau 1 = Cd \cdot Rd$. In contrast, in case of a short occurring in the light-emitting element, the time constant $\tau 2$ is changed to a time constant $\tau 2$, which may approximately be determined as $\tau 2 = Cd \cdot Rsh$, where Rsh is the equivalent dynamic resistance of the light-emitting element in case of a short. (In a more complex model for determining the time constant $\tau 2$, also the fact may be taking into account that in case of a short also the effective capacitance Cd of the light-emitting element may change to a certain degree.) This later time constant $\tau 2$, which determines the discharge time with a short, is always smaller than the time constant $\tau 1$. The time period may thus suitably be chosen to be smaller than $\tau 1$ (cf. above) but larger than $\tau 2$, in which case the short detection unit can be adapted to detect a short in the light-emitting element if the determined voltage across the light-emitting element is 0V or almost 0V. Of course, the time period may also be chosen to be equal to—or even smaller than—the time constant $\tau 2$, as long as the drop of the voltage across the light-emitting element during the time period is large enough to be reliably detected and, in particular, be distinguished from voltage variations that are the result of production tolerances, changes in the environment temperature, etc. For example, the time period may be chosen such that for a defect light-emitting element, the voltage drops during the time period to half or a third of the voltage normally occurring at the given driving current.

It is further preferred that the triggering unit is connected to the switchable current source and adapted to switch off the switchable current source during the time period.

Therewith, a full control over both the switchable current source and the voltage determining unit is possible by means of the triggering unit. This allows to easily synchronize the determination of the voltage across the light-emitting element by the voltage determining unit with the provision of the driving current to the light-emitting element by the switchable current source.

It is preferred that the triggering unit is adapted to periodically trigger the triggerable voltage determining unit.

By doing so, the electroluminescent device can be repeatedly checked for the presence of a short in the light-emitting element. This helps to also safely detect shorts in the light-emitting element which only occur at some point in time during operation of the electroluminescent device.

It is further preferred that the triggering unit is adapted to be synchronized with a pulse width modulation signal for switching the switchable current source on and off, such that the time period falls within a pulse width modulation time interval during which the switchable current source is switched on by the pulse width modulation signal.

This allows the short detection to be easily combined with PWM dimming. It is also preferred that the triggering unit is adapted to trigger the triggerable voltage determining unit during a process of turning on and/or turning off the electroluminescent device.

Therewith, the electroluminescent device can be checked for the presence of a short in the light-emitting diode at the start and/or end of operation of the electroluminescent device.

It is preferred that the voltage determining unit is a sample-and-hold element.

This makes it possible to hold the determined voltage across the light-emitting element in order for the short detection unit to detect a short in the light-emitting element based on the determined voltage across the light-emitting element.

It is preferred that the electroluminescent device comprises a further light-emitting element having a capacitance, wherein the further light-emitting element is connected in series with the light-emitting element, wherein the switchable current source is adapted to provide the driving current to the series connection of the light-emitting element and the further light-emitting element, wherein the short detection circuit further comprises a further triggerable voltage determining unit for determining, upon being triggered, a voltage across the further light-emitting element, wherein the triggering unit is adapted to trigger the further triggerable voltage determining unit to determine the voltage across the further light-emitting element after a time period during which the driving current is not provided to the further light-emitting element, wherein the short detection unit is adapted to detect a short in the further light-emitting element based on the determined voltage across the further light-emitting element.

With this configuration, it is possible to uniquely identify a light-emitting element with a short in a "string" of light-emitting elements, i.e., in an arrangement, in which the light-emitting elements are connected in series. Herein, also the further light-emitting element can be an organic light-emitting diode (OLED), or, the further light-emitting element can comprise a light-emitting diode (LED), wherein the capacitance is connected in parallel to the LED.

It is also preferred that the electroluminescent device further comprises a further light-emitting element having a capacitance, wherein the further light-emitting element is connected in parallel to the light-emitting element, wherein the switchable current source is adapted to provide the driving current to the parallel connection of the light-emitting element and the further light-emitting element, wherein the short detection circuit further comprises a further triggerable voltage determining unit for determining, upon being triggered, a voltage across the further light-emitting element, wherein the triggering unit is adapted to trigger the further triggerable voltage determining unit to determine the voltage across the further light-emitting element after a time period during which the driving current is not provided to the further light-emitting element, wherein the short detection unit is adapted to detect a short in the further light-emitting element based on the determined voltage across the further light-emitting element.

With this configuration, it is possible to uniquely identify a light-emitting element with a short in an arrangement, in which the light-emitting elements are connected in parallel. Herein, also the further light-emitting element can be an organic light-emitting diode (OLED), or, the further light-emitting element can comprise a light-emitting diode (LED), wherein the capacitance is connected in parallel to the LED.

By combining the above series and parallel configurations, an electroluminescent device can be realized in which it is possible to uniquely identify a light-emitting element with a short in a 2×2 array arrangement. Moreover, the concept can be extended to arrangements, in which more than two light-emitting elements are connected in series and/or more than two light-emitting elements are connected in parallel. For example, the concept may used in an electroluminescent device comprising 16 light-emitting elements in a 4×4 array arrangement.

With the above parallel configuration, it is preferred that the electroluminescent device further comprises a decoupling element being connected in series between the switchable current source and the light-emitting element and a further decoupling element being connected in series between the switchable current source and the further light-emitting element.

By means of the decoupling elements, a discharge of the capacitors of the light-emitting elements can be prevented in a prestine electroluminescent device, resulting in a more robust short detection that can better avoid "false alarms", i.e., cases where a short is incorrectly detected in a light-emitting element without a short.

It is further preferred that the decoupling element and/or the further decoupling element are diodes. Alternatively, the decoupling element and/or the further decoupling element can also be switching elements, e.g., MOSFETs, that are controlled to perform a function comparable to diodes. Of course, a combination of a diode and a switching element may also be utilized.

It is preferred that the electroluminescent device further comprising a further light-emitting element having a capacitance, wherein the further light-emitting element is connected in parallel to the light-emitting element, and a further switchable current source being connected to the further light-emitting element for providing a driving current to the further light-emitting element, wherein the short detection circuit further comprises a further triggerable voltage determining unit for determining, upon being triggered, a voltage across the further light-emitting element, wherein the triggering unit is adapted to trigger the further triggerable voltage determining unit to determine the voltage across the further light-emitting element after a time period during which the driving current is not provided to the further light-emitting element, wherein the short detection unit is adapted to detect a short in the further light-emitting element based on the determined voltage across the further light-emitting element.

It is further preferred that the short detection circuit further comprises a short protection unit for turning off the electroluminescent device if a short is detected in the light-emitting element.

By turning off the electroluminescent device if a short is detected in the light-emitting element, e.g., for OLEDs, the risk of providing a danger for a human being due to the high local temperature at the location of the short (i.e., due to the "hot spot" effect), which can easily reach values well above 100 degrees Celsius, can be reduced. The short protection unit can be connected to the switchable current source and can be adapted to turn off the switchable current source if a short is detected in the light-emitting element.

In a second aspect of the present invention, a short detecting method for detecting a short in a light-emitting element having a capacitance is presented, the short detection method being adapted for use in an electroluminescent device comprising the light-emitting element and a switchable current source being connected to the light-emitting element for providing a driving current to the light-emitting element, wherein the short detection method comprises:

triggering a triggerable voltage determining unit to determine a voltage across the light-emitting element after a time period during which the driving current is not provided to the light-emitting element, by a triggering unit, determining, upon being triggered, the voltage across the light-emitting element, by the triggerable voltage determining unit, and detecting a short in the light-emitting element based on the determined voltage across the light-emitting element, by a short detection unit.

It shall be understood that the electroluminescent device of the first aspect, and the short detection method of the second aspect have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
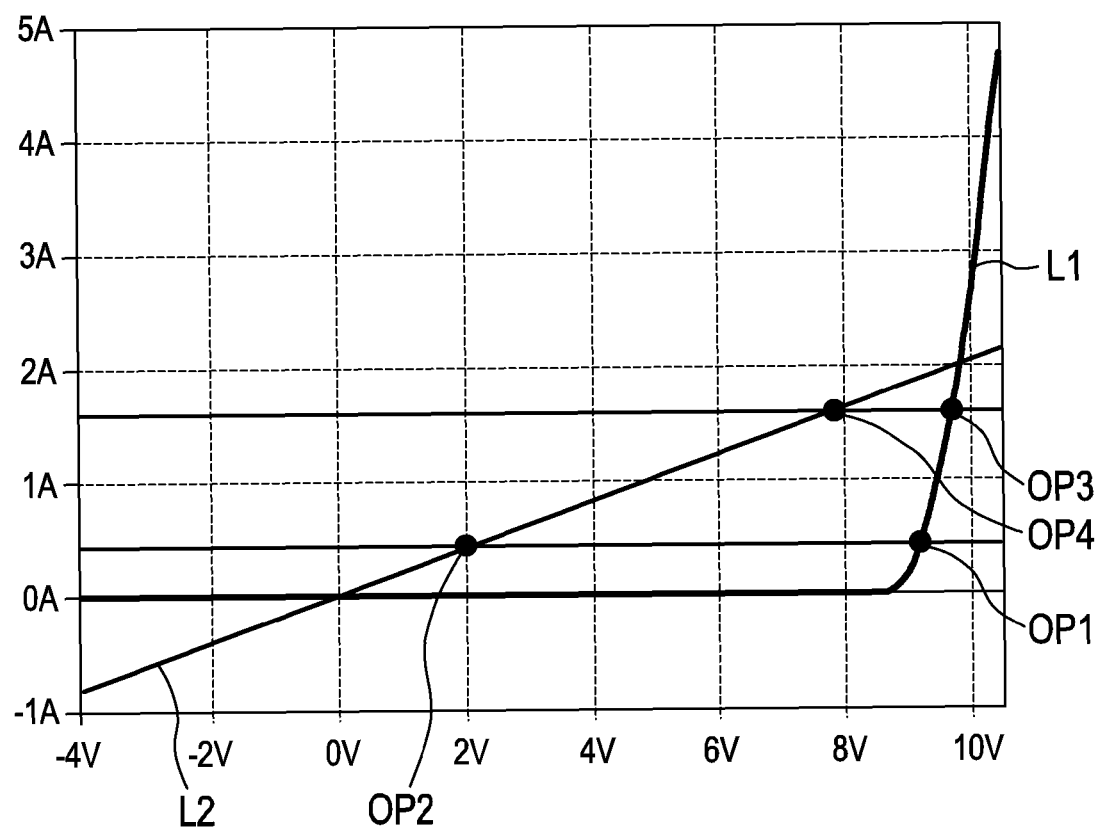
FIG. 1 shows schematically and exemplarily a relationship between the driving current and the forward voltage of an OLED with and without a short.

In the drawings, like or corresponding reference numerals refer to like or corresponding parts and/or elements.

FIG. 1 shows schematically and exemplarily a relationship (IV-curve) between the driving current (vertical axis) and the voltage (horizontal axis) across an OLED with and without a short. As can be realized from the curve L1, without a short, the OLED exhibits the typical, highly non-linear characteristic having, in this example, a forward voltage of 8.5V. In contrast, with a short, the behaviour of the OLED is more or less linear, as indicated by the curve L2. If the OLED is provided with a driving current, e.g., of 300 mA, the OLED operates at a voltage of 9V without a short (operating point OP1), whereas for a defective OLED, the voltage drops to 2V for the same driving current (operating point OP2). If the OLED is provided with a higher driving current, e.g., of 1.6 A, the OLED operates at a voltage of 9.5V without a short (operating point OP3), whereas for a defective OLED, the voltage drops to about 7.8V for the same driving current (operating point OP4). This illustrates that prior art methods for short detection, which, e.g., consider the OLED to be defective if the OLED voltage falls below a predefined voltage threshold, are dependent on a characteristic absolute voltage threshold that is rather sensitive with respect to production tolerances and the like.

Figure 2:
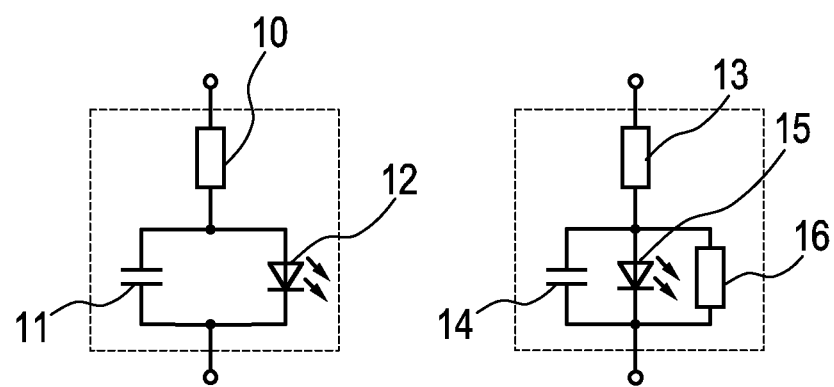
FIG. 2 shows schematically and exemplarily an equivalent circuit of an OLED with and without a short.

The above discharge behaviour can be understood by considering an equivalent circuit of an OLED with and without a short, which is shown schematically and exemplarily in FIG. 2. In the situation without a short (left side of the figure), a resistance 10 models lateral losses, which can occur, in particular, for large area OLEDs, a capacitance 11 represents an internal capacitance of the OLED, and a diode 12 models the non-linear behaviour of the light-emitting area of the OLED. The same elements, a resistance 13, a capacitance 14, and a diode 15 are also present in the situation with a short (right side of the figure), but due to the short, an additional resistance 16 appears in parallel to the internal capacitance 15 of the OLED. It is this additional resistance 16 that is responsible for the rapid discharge of the internal capacitance 15 in the presence of the short.

Figure 3:
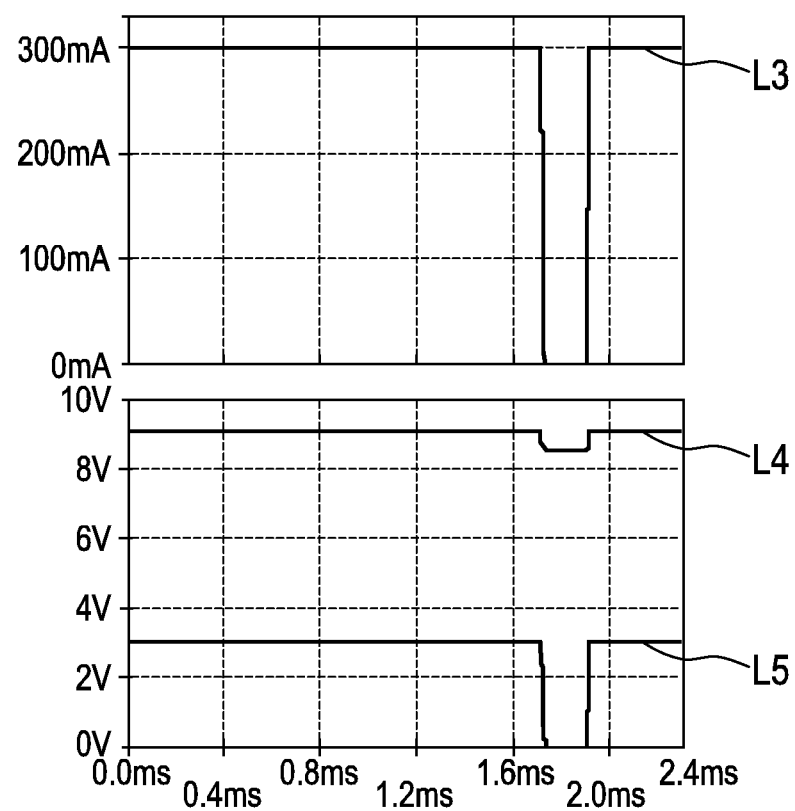
FIG. 3 shows schematically and exemplarily details of the discharge behaviour of the OLED of FIG. 1 with and without a short when the driving current is switched off for a short time period.

FIG. 3 shows schematically and exemplarily details of the discharge behaviour of the OLED of FIG. 1 with and without a short when the driving current (curve L3 in the upper graph of the figure), here, of 300 mA, is switched off for a short time period, here, 0.2 ms. As can be seen from the curve L4 in the lower graph of the figure, in the situation without a short, the voltage across the OLED drops from 9V to about 8.5V during the 0.2 ms time period during which the driving current is switched off. In contrast, in the situation with a short (curve L5 in the lower graph of the figure), the voltage across the OLED is 2.3V when the driving current of 300 mA is provided to the OLED and drops almost instantaneously to (almost) 0V during the 0.2 ms time period during which the driving current is switched off. As already mentioned above, this difference in the discharge behaviour of a prestine vs. a defective OLED ("light-emitting element"), which involves very different time constants, can be used for detecting a short in the OLED.

Figure 4:
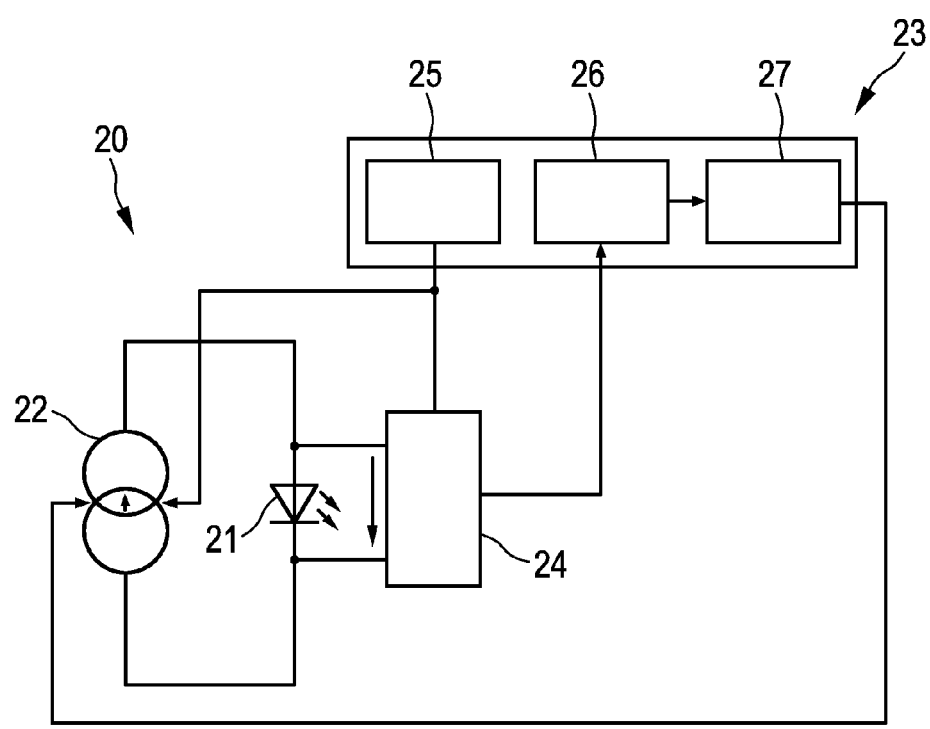
FIG. 4 shows schematically and exemplarily a first embodiment of an electroluminescent device.

FIG. 4 shows schematically and exemplarily a first embodiment of an electroluminescent device 20. The electroluminescent device 20 comprises a light-emitting element 21, here, an OLED, having a capacitance, here, comprising an internal capacitance (not shown in the figure), a switchable current source 22 being connected to the OLED 21 for providing a driving current to the OLED 21, and a short detection circuit 23 for detecting a short in the OLED 21.

The short detection circuit 23 comprises a triggerable voltage determining unit 24, here, a sample-and-hold element, for determining, upon being triggered, a voltage across the OLED 21, a triggering unit 25 for triggering the sample-and-hold element 24 to determine the voltage across the OLED 21 after a time period $\Delta t$ during which the driving current is not provided to the OLED 21, and a short detection unit 26 for detecting a short in the OLED 21 based on the determined voltage across the OLED 21. In this example, the triggering unit 25 is connected to the switchable current source 22 and adapted to switch off the switchable current source 22 during the time period $\Delta t$. Moreover, the short detection circuit 23, in this embodiment, further comprises a short protection unit 27 for turning off the electroluminescent device 20 if a short is detected in the OLED 21. The short protection unit 27, in this case, is connected to the switchable current source 22 and is adapted to turn off the switchable current source 22 if a short is detected in the OLED 21.

The short detection by means of the short detection circuit 23 will be described in the following with reference to FIG. 5, which shows schematically and exemplarily details of the temporal behaviour of the short detection circuit 23 of FIG. 4. As can be seen from the curve L6 in the lowermost graph of the figure, for most of the time, the switchable current source 22 provides a driving current, here, of 300 mA, to the OLED 21. However, periodically, the switchable current source 22 is switched off by the triggering unit 25 during respective time periods $\Delta t$. The length of the time periods $\Delta t$, in this example, is 10 µs. As can further be seen from the curve L7 in the second uppermost graph of the figure, in synchronism with the periodic switching off of the switchable current source 22, the triggering unit 25 periodically triggers the sample-and-hold element 24, here, by providing a voltage signal (curve L7) that is periodically set from 1V to 0V to the sample-and-hold element 24, to determine the voltage across the OLED 21 after the respective 10 µs time periods $\Delta t$. The temporal behaviour of this voltage across the OLED 21 is then given by the curve L8 in the second lowermost graph of the figure. As already described above, if the OLED 21 is provided with the driving current of 300 mA, the OLED 21 operates at a voltage of 9V without a short, wherein the OLED voltage drops from 9V to about 8.5V during each 10 µs time period $\Delta t$ during which the driving current is switched off (left part of curve L8). At about 6.5 ms, shortly after a previous trigger "event", a short occurs in the OLED 21. Due to this short, the voltage across the OLED 21 drops to about 2.3V when the driving current is provided to the OLED 21 and drops almost instantaneously to (almost) 0V during the 10 µs time periods $\Delta t$ during which the driving current is switched off (right part of curve L8). Now, the determined voltage across the OLED 21, i.e., the voltage determined by the sample-and-hold element 24 after the respective 10 µs time periods Δt, is given by the curve L9 in the uppermost graph of the figure. As can be seen, this voltage is 8.5V before the occurrence of the short at about 6.5 ms, because this is the value to which the voltage across the OLED 21 drops during the respective 10 µs time periods Δt in the situation without a short. In contrast, starting from the first 10 µs time period Δt after the occurrence of the short at about 6.5 ms, the determined voltage across the OLED 21 is (almost) 0V, because this is the value to which the voltage across the OLED 21 drops during the respective 10 µs time periods Δt in the situation with a short. The respective determined voltage across the OLED 21 is, in this example, held by the sample-and-hold element 24 until the voltage across the OLED 21 is newly determined after the next 10 µs time period Δt.

With returning reference to FIG. 4, the short detection unit 26 is adapted, in this example, to detect a short in the OLED 21 if the determined voltage across the OLED 21 is (almost) 0V.

Figure 6:
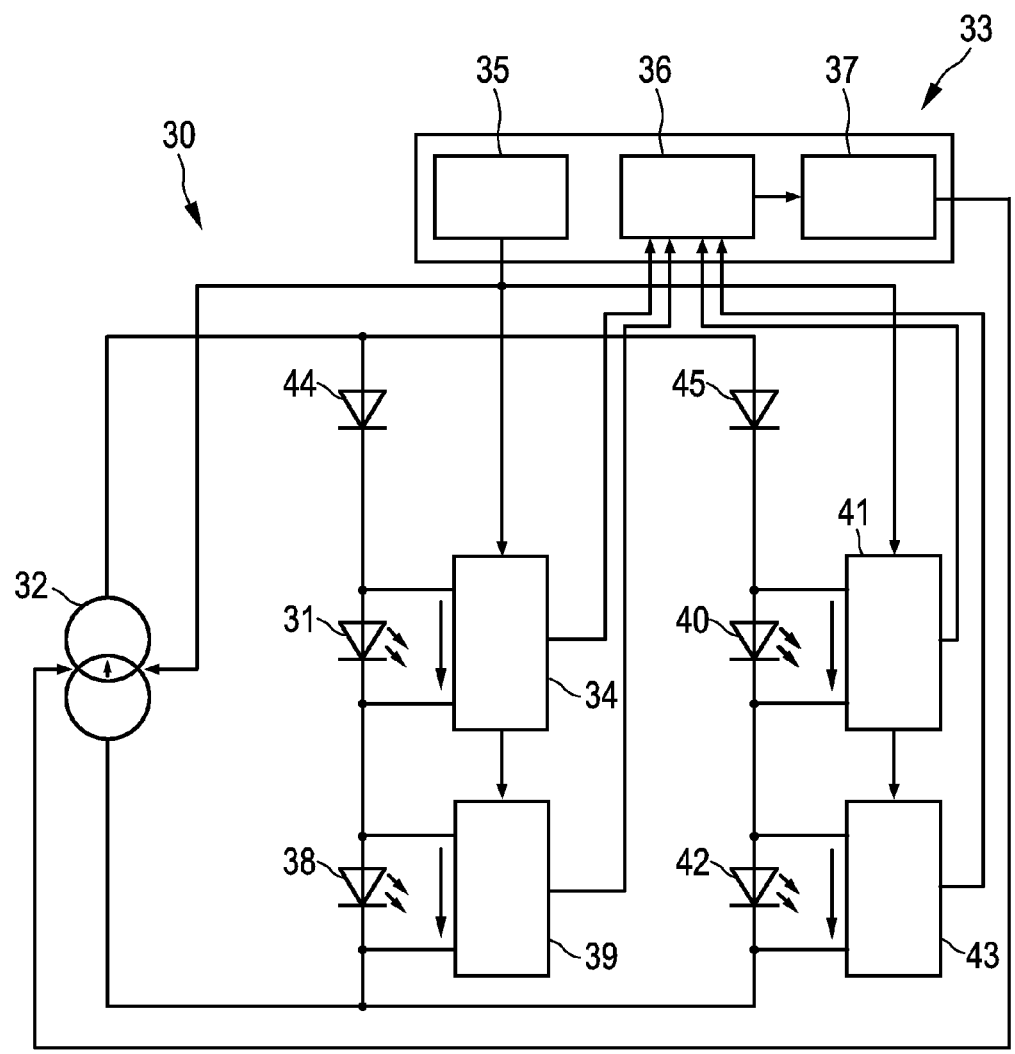
FIG. 6 shows schematically and exemplarily a second embodiment of an electroluminescent device.

FIG. 6 shows schematically and exemplarily a second embodiment of an electroluminescent device 30. The electroluminescent device 30 comprises a light-emitting element 31, here, an OLED, having a capacitance, here, comprising an internal capacitance (not shown in the figure), a switchable current source 32 being connected to the OLED 31 for providing a driving current to the OLED 31, and a short detection circuit 33 for detecting a short in the OLED 31.

The short detection circuit 33 comprises a triggerable voltage determining unit 34, here, a sample-and-hold element, for determining, upon being triggered, a voltage across the OLED 31, a triggering unit 35 for triggering the sample-and-hold element 34 to determine the voltage across the OLED 31 after a time period Δt during which the driving current is not provided to the OLED 31, and a short detection unit 36 for detecting a short in the OLED 31 based on the determined voltage across the OLED 31. In this example, the triggering unit 35 is connected to the switchable current source 32 and adapted to switch off the switchable current source 32 during the time period Δt. Moreover, the short detection circuit 33, in this embodiment, further comprises a short protection unit 37 for turning off the electroluminescent device 30 if a short is detected in the OLED 31. The short protection unit 37, in this case, is connected to the switchable current source 32 and is adapted to turn off the switchable current source 32 if a short is detected in the OLED 31.

The electroluminescent device 30, here, further comprises a further light-emitting element 38, here, a further OLED, having a capacitance, here, comprising an internal capacitance (not shown in the figure), wherein the further OLED 38 is connected in series with the OLED 31, wherein the switchable current source 32 is adapted to provide the driving current to the series connection of the OLED 31 and the further OLED 38. The short detection circuit 33 further comprises a further triggerable voltage determining unit 39, here, a further sample-and-hold element, for determining, upon being triggered, a voltage across the further OLED 38, wherein the triggering unit 35 is adapted to trigger the further sample-and-hold-element 39 to determine the voltage across the further OLED 38 after a time period Δt during which the driving current is not provided to the further OLED 38, wherein the short detection unit 36 is adapted to detect a short in the further OLED 38 based on the determined voltage across the further OLED 38.

The electroluminescent device 30, here, further comprises a further light-emitting element 40, here, a further OLED, having a capacitance, here, comprising an internal capacitance (not shown in the figure), wherein the further OLED 40 is connected in parallel to the OLED 31, wherein the switchable current source 32 is adapted to provide the driving current to the parallel connection of the OLED 31 and the further OLED 40. The short detection circuit 33 further comprises a further triggerable voltage determining unit 41, here, a further sample-and-hold element, for determining, upon being triggered, a voltage across the further OLED 40, wherein the triggering unit 35 is adapted to trigger the further sample-and-hold-element 41 to determine the voltage across the further OLED 40 after a time period Δt during which the driving current is not provided to the further OLED 40, wherein the short detection unit 36 is adated to detect a short in the further OLED 40 based on the determined voltage across the further OLED 40.

As can be seen from FIG. 6, in this embodiment, the electroluminescent device 30 further comprises a decoupling element 44, here, a diode, being connected in series between the switchable current source 32 and the light-emitting element 31 and a further decoupling element 45, here, a further diode, being connected in series between the switchable current source 32 and the further light-emitting element 40. Moreover, the electroluminescent device 30 further comprises yet a further OLED 42, which is arranged with the other OLEDs 31, 38, 40 in a 2×2 array, and the short detection circuit 33 comprises yet a further sample-and-hold element 43. With this configuration, it is possible to uniquely identify an OLED 31, 38, 40, 42 with a short in the 2×2 array arrangement.

The short detection by means of the short detection circuit 33 will be described in the following with reference to FIG. 7, which shows schematically and exemplarily details of the temporal behaviour of the short detection circuit 33 of FIG. 6. As can be seen from the curves L10 and L11 in the lowermost graph of the figure, for most of the time, the switchable current source 32 provides a driving current, here, of 600 mA total, to the OLEDs 31, 38, 40, 42, which, without a short, is substantially evenly distributed over the two strings of OLEDs 31, 38 and 40, 42. However, periodically, the switchable current source 32 is switched off by the triggering unit 35 during respective time periods Δt. The length of the time periods Δt, in this example, is 10 µs. As can further be seen from the curve L12 in the fifth uppermost graph of the figure, in synchronism with the periodic switching off of the switchable current source 32, the triggering unit 35 periodically triggers the sample-and-hold elements 34, 39, 41, 43, here, by providing a voltage signal (curve L12) that is periodically set from 1V to 0V to the sample-and-hold elements 34, 39, 41, 43, to determine the voltages across the OLEDs 31, 38, 40, 42 after the respective 10 µs time periods Δt. The temporal behaviour of these voltages across the OLEDs 31, 38, 40, 42 is then given by the curves L13, L14, L15, L16 in the second to fifth lowermost graphs of the figure. As already described above, if the OLEDs 31, 38, 40, 42 are provided with a driving current of 300 mA, the OLEDs 31, 38, 40, 42 operate at a voltage of 9V without a short (leftmost part of curves L13, L14, L15, L16). At about 0.2 ms, between two trigger "events", a short occurs in the OLED 31. Due to the short, the voltage across the OLED 31 drops to about 5V when the driving current is provided to the OLED 31 and drops substantially instantaneously to (almost) 0V during the 10 µs time periods Δt during which the driving current is switched off (left part of curve L13). The short in the OLED 31 also influences the distribution of the driving current over the two strings of OLEDs 31, 38 and 40, 42 as well as the voltages across the other OLEDs 38, 40, 42

(curves L10, L11 and L14, L15, L16). At about 1.2 ms, 2.2 ms, and 3.2 ms, further shorts then occur also the in other OLEDs 38, 40, 42. Due to these shorts, the voltages across the OLEDs 38, 40, 42 drop to respective voltages (which depend on the respective number of already defective OLEDs) when the driving current is provided to the OLEDs 38, 40, 42 and drop, for each OLED 38, 40, 42, almost instantaneously to (almost) 0V during the 10 µs time periods Δt during which the driving current is switched off (curves L14, L15, L16). Now, the determined voltages across the OLEDs 31, 38, 40, 42, i.e., the voltages determined by the sample-and-hold elements 34, 39, 41, 43 after the respective 10 µs time periods Δt, are given by the curves L17, L18, L19, L20 in the four uppermost graphs of the figure. As can be seen, these voltages are about 8.5V and slightly lower before the occurrence of the shorts at about 0.2 ms, 1.2 ms, 2.2 ms, and 3.2 ms, because these are the values to which the voltages across the OLEDs 31, 38, 40, 42 drop during the respective 10 µs time periods Δt in the situation without a short. In contrast, starting from the first 10 µs time period Δt after the occurrence of the shorts at about 0.2 ms, 1.2 ms, 2.2 ms, and 3.2 ms, the determined voltages across the OLEDs 31, 38, 40, 42 are (almost) 0V, because this is the value to which the voltages across the OLEDs 31, 38, 40, 42 drop during the respective 10 µs time periods Δt in the situation with a short. The respective determined voltages across the OLEDs 31, 38, 40, 42 are, in this example, held by the sample-and-hold elements 34, 39, 41, 43 until the voltages across the OLEDs 31, 38, 40, 42 are newly determined after the next 10 µs time period Δt.

With returning reference to FIG. 7, the short detection unit 36 is adapted, in this example, to detect a short in the OLED 31 if the determined voltage across the OLED 31 is (almost) 0V. Likewise, the short detection unit 36 is adapted to detected a short in any of the other OLEDs 38, 40, 42 if the determined voltage across any of the other OLEDs 38, 40, 42 is (almost) 0V.

Figure 8:
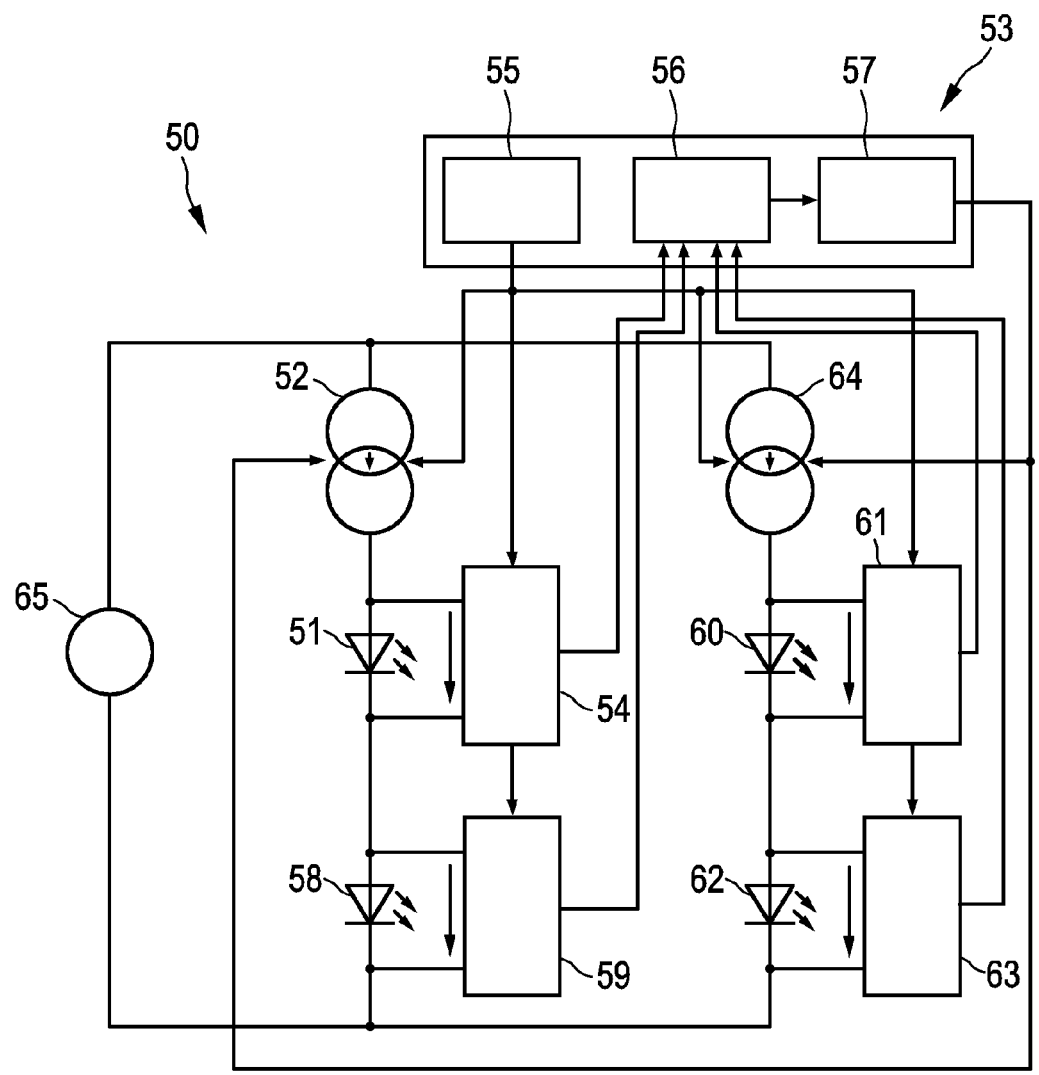
FIG. 8 shows schematically and exemplarily a third embodiment of an electroluminescent device.

FIG. 8 shows schematically and exemplarily a third embodiment of an electroluminescent device 50. The electroluminescent device 50 comprises a light-emitting element 51, here, an OLED, having a capacitance, here, comprising an internal capacitance (not shown in the figure), a switchable current source 52 being connected to the OLED 51 for providing a driving current to the OLED 51, and a short detection circuit 53 for detecting a short in the OLED 51.

The short detection circuit 53 comprises a triggerable voltage determining unit 54, here, a sample-and-hold element, for determining, upon being triggered, a voltage across the OLED 51, a triggering unit 55 for triggering the sample-and-hold element 54 to determine the voltage across the OLED 51 after a time period Δt during which the driving current is not provided to the OLED 51, and a short detection unit 56 for detecting a short in the OLED 51 based on the determined voltage across the OLED 51. In this example, the triggering unit 55 is connected to the switchable current source 52 and adapted to switch off the switchable current source 52 during the time period Δt. Moreover, the short detection circuit 53, in this embodiment, further comprises a short protection unit 57 for turning off the electroluminescent device 50 if a short is detected in the OLED 51. The short protection unit 57, in this case, is connected to the switchable current source 52 and is adapted to turn off the switchable current source 52 if a short is detected in the OLED 51.

The electroluminescent device 50, here, further comprises a further light-emitting element 58, here, a further OLED, having a capacitance, here, comprising an internal capacitance (not shown in the figure), wherein the further OLED 58 is connected in series with the OLED 51, wherein the switchable current source 52 is adapted to provide the driving current to the series connection of the OLED 51 and the further OLED 58. The short detection circuit 53 further comprises a further triggerable voltage determining unit 59, here, a further sample-and-hold element, for determining, upon being triggered, a voltage across the further OLED 58, wherein the triggering unit 55 is adapted to trigger the further sample-and-hold-element 59 to determine the voltage across the further OLED 58 after the time period Δt, wherein the short detection unit 56 is adapted to detect a short in the further OLED 58 based on the determined voltage across the further OLED 58.

The electroluminescent device 50, here, further comprises a further light-emitting element 60, here, a further OLED, having a capacitance, here, comprising an internal capacitance (not shown in the figure), wherein the further OLED 60 is connected in parallel to the OLED 51, and a further switchable current source 64 being connected to the further light-emitting element 60 for providing a driving current to the further light-emitting element 60. (The switchable current source 52 and the further switchable current source 64 are both powered, in this embodiment, by a power source 65). The short detection circuit 53 further comprises a further triggerable voltage determining unit 61, here, a further sample-and-hold element, for determining, upon being triggered, a voltage across the further OLED 60, wherein the triggering unit 55 is adapted to trigger the further sample-and-hold-element 61 to determine the voltage across the further OLED 60 after a time period Δt during which the driving current is not provided to the further light-emitting element 60, wherein the short detection unit 56 is adapted to detect a short in the further OLED 60 based on the determined voltage across the further OLED 60.

As can be seen from FIG. 8, in this embodiment, the electroluminescent device 50 does not comprise decoupling elements as utilized in the second embodiment described with reference to FIG. 6 (cf. reference numerals 44 and 45 therein). Instead, a comparable decoupling is achieved by means of the two separate switchable current sources 52 and 64. The electroluminescent device 50 further comprises yet a further OLED 62, which is arranged with the other OLEDs 51, 58, 60 in a 2×2 array, and the short detection circuit 53 comprises yet a further sample-and-hold element 63. With this configuration, it is possible to uniquely identify an OLED 51, 58, 60, 62 in the 2×2 array arrangement.

In the following, an embodiment of an embodiment 100 of a short detection method for detecting a short in a light-emitting element 21 will exemplarily be described with reference to a flowchart shown in FIG. 9. The short detection method 100 is adapted for use in an electroluminescent device 20, as shown e.g. in FIG. 4, comprising the light-emitting element 21, here, an OLED, having a capacitance, here, comprising an internal capacitance (not shown in the figure), a switchable current source 22 being connected to the OLED 21 for providing a driving current to the OLED 21, and a short detection circuit 23 for detecting a short in the OLED 21.

In step 101, a triggerable voltage determining unit 21 is triggered to determine a voltage across the light-emitting element 21 after a time period Δt during which the driving current is not provided to the light-emitting element 21, by a triggering unit 25. In step 102, upon being triggered, the voltage across the light-emitting element 21 is determined, by the triggerable voltage determining unit 24. In step 103, a short is detected in the light-emitting element 21 based on the determined voltage across the light-emitting element 21, by a short detection unit 26.

Figure 9:
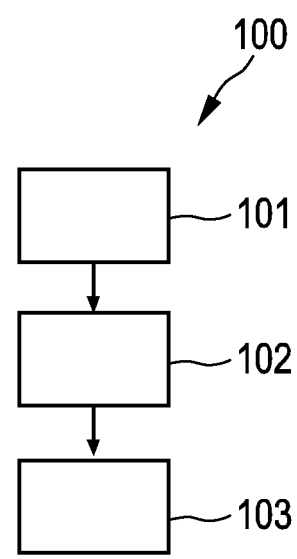
FIG. 9 shows a flowchart exemplarily illustrating an embodiment of a short detection method for detecting a short in a light-emitting element.

While in the embodiment of the short detection method 100 shown in FIG. 9, the short detection method 100 is adapted for use in an electroluminescent device 20, as shown e.g. in FIG. 4, the method can also be adapted for use in an electroluminescent device 30, as shown in FIG. 6, or in an electroluminescent device 50, as shown in FIG. 8. Further features of the short detection method can be understood from the description relating to the electroluminescent device 20, as shown in FIG. 4, the electroluminescent device 30, as shown in FIG. 6, and the electroluminescent device 50, as shown in FIG. 8.

While in the embodiments of an electroluminescent device 20, 30, 50 shown in FIGS. 4, 6, and 8, the light-emitting element(s) is/are (an) OLED(s) having a capacitance that comprises an internal capacitance (not shown in the figures), in other embodiments, the light-emitting element(s) can also be (an) LED(s) having a capacitance that comprises an external capacitance being connected in parallel to the LED.

Figure 5:
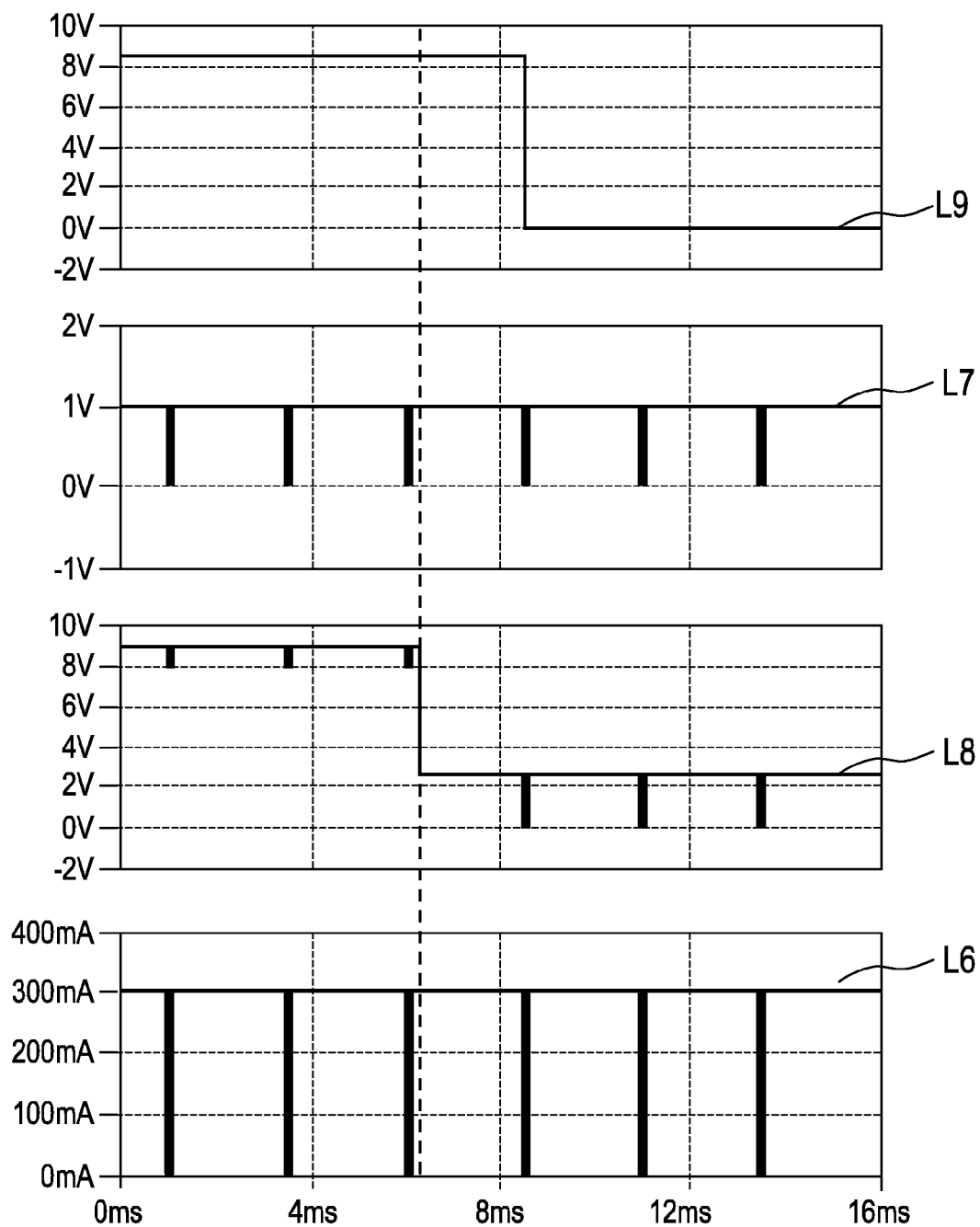
FIG. 5 shows schematically and exemplarily details of the temporal behaviour of the short detection circuit of FIG. 4.
Figure 7:
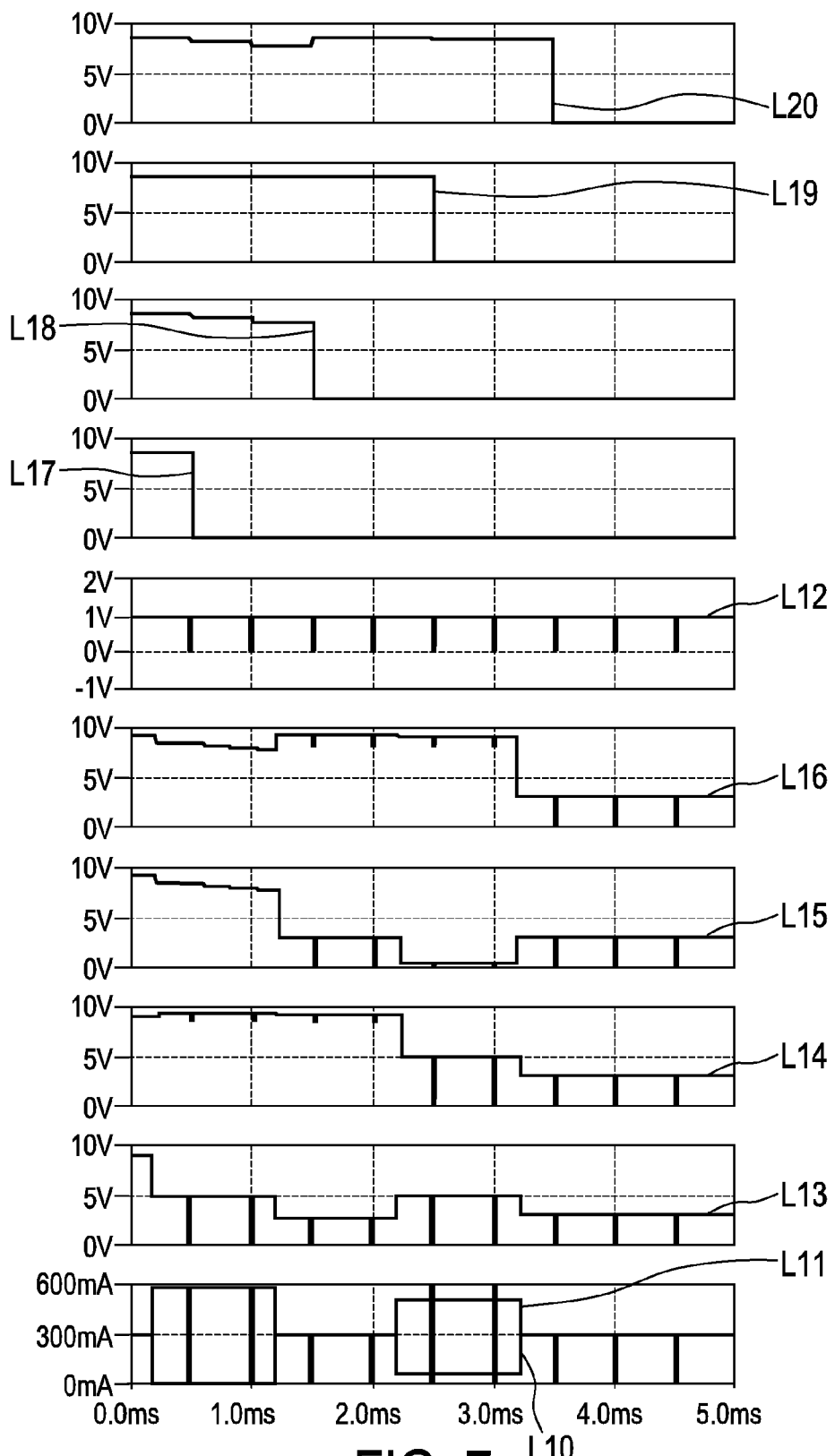
FIG. 7 shows schematically and exemplarily details of the temporal behaviour of the short detection circuit of FIG. 6.

It is noted that in FIGS. 5 and 7, the waveforms are shown for the case where the switchable current sources are realized using linear drop out regulators, which are able to deliver an (almost) perfectly constant driving current. It is, however, also possible that the switchable current sources are realized using e.g. highly efficient hysteric buck switch mode power supplies. A typical characteristic of such power supplies is that the delivered current varies between an upper value and a lower value (i.e., the hysteresis value) at a very high switching frequency, which may be in the range of e.g. 1 to 2 MHz. While it is a design objective for such power supplies to make the hysteresis band as small as possible, it cannot be avoided completely. It is therefore preferred that with such power supplies the time period Δt is larger than the period corresponding to the switching frequency.

While FIGS. 5 and 7 shows examples, in which the triggering unit periodically triggers the triggerable voltage determining unit, so that the OLED is repeatedly checked for the presence of a short in the OLED, it is, additionally or alternatively, also possible that the triggering unit is adapted to trigger the triggerable voltage determining unit during a process of turning on or turning off the electroluminescent device. It is also possible that the triggering unit is adapted to be synchronized with a pulse width modulation signal for switching the switchable current source on and off, such that the time period (Δt) falls within a pulse width modulation time interval during which the switchable current source is switched on by the pulse width modulation signal.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. For example, in the first embodiment of an electroluminescent device 20, as shown in FIG. 4, the triggering unit 25, the short detection unit 26, and the short protection unit 27 illustrated as three separate units, they may also be realized as a single unit. The mere fact that certain measures are recited in mutually different dependent claims does not indicate that a combination of these measures cannot be used to advantage.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The present invention relates to an electroluminescent device with a light-emitting element having a capacitance, a switchable current source being connected to the light-emitting element for providing a driving current to the light-emitting element, and a short detection circuit for detecting a short in the light-emitting element. The short detection circuit comprises a triggerable voltage determining unit for determining, upon being triggered, a voltage across the light-emitting element, a triggering unit for triggering the triggerable voltage determining unit to determine the voltage across the light-emitting element after a time period during which the driving current is not provided to the light-emitting element, and a short detection unit for detecting a short in the light-emitting element based on the determined voltage across the light-emitting element. Therewith, the detection can be less sensitive with respect to production tolerances and the like.

The invention claimed is:

1. An electroluminescent device, comprising:
   a light-emitting element having a capacitance,
   a switchable current source being connected to the light-emitting element for providing a driving current to the light-emitting element, and
   a short detection circuit for detecting a short in the light-emitting element, wherein the short detection circuit comprises:
   a triggerable voltage determining unit for determining, upon being triggered, a voltage across the light-emitting element,
   a triggering unit for triggering the triggerable voltage determining unit to determine the voltage across the light-emitting element after a time period (Δt) during which the driving current is not provided to the light-emitting element, and
   a short detection unit for detecting a short in the light-emitting element based on the determined voltage across the light-emitting element.

2. The electroluminescent device as defined in claim 1, wherein the time period (Δt) is shorter than a discharge time (τ2) required for the capacitance to become discharged when the driving current is not provided to the light-emitting element in case there is no short in the light-emitting element.

3. The electroluminescent device as defined in claim 1, wherein the triggering unit is connected to the switchable current source and adapted to switch off the switchable current source during the time period (Δt).

4. The electroluminescent device as defined in claim 1, wherein the triggering unit is adapted to periodically trigger the triggerable voltage determining unit.

5. The electroluminescent device as defined in claim 3, wherein the triggering unit is adapted to be synchronized with a pulse width modulation signal for switching the switchable current source on and off, such that the time period (Δt) falls within a pulse width modulation time interval during which the switchable current source is switched on by the pulse width modulation signal.

6. The electroluminescent device as defined in claim 1, wherein the triggering unit is adapted to trigger the triggerable voltage determining unit during a process of turning on or turning off the electroluminescent device.

7. The electroluminescent device as defined in claim 1, further comprising a further light-emitting element having a capacitance, wherein the further light-emitting element is connected in series with the light-emitting element, wherein the switchable current source is adapted to provide the driving current to the series connection of the light-emitting element and the further light-emitting element, wherein the short detection circuit further comprises a further triggerable voltage determining unit for determining, upon being triggered, a voltage across the further light-emitting element, wherein the triggering unit is adapted to trigger the further triggerable voltage determining unit to determine the voltage across the further light-emitting element after a time period ($\Delta t$) during which the driving current is not provided to the further light-emitting element, wherein the short detection unit is adapted to detect a short in the further light-emitting element based on the determined voltage across the further light-emitting element.

8. The electroluminescent device as defined in claim 1, further comprising a further light-emitting element having a capacitance, wherein the further light-emitting element is connected in parallel to the light-emitting element, wherein the switchable current source is adapted to provide the driving current to the parallel connection of the light-emitting element and the further light-emitting element, wherein the short detection circuit further comprises a further triggerable voltage determining unit for determining, upon being triggered, a voltage across the further light-emitting element, wherein the triggering unit is adapted to trigger the further triggerable voltage determining unit to determine the voltage across the further light-emitting element after a time period ($\Delta t$) during which the driving current is not provided to the further light-emitting element, wherein the short detection unit is adapted to detect a short in the further light-emitting element based on the determined voltage across the further light-emitting element.

9. The electroluminescent device as defined in claim 8, further comprising a decoupling element being connected in series between the switchable current source and the light-emitting element and a further decoupling element being connected in series between the switchable current source and the further light-emitting element.

10. The electroluminescent device as defined in claim 9, wherein the decoupling element and/or the further decoupling element are diodes.

11. The electroluminescent device as defined in claim 1, further comprising a further light-emitting element having a capacitance, wherein the further light-emitting element is connected in parallel to the light-emitting element, and a further switchable current source being connected to the further light-emitting element for providing a driving current to the further light-emitting element, wherein the short detection circuit further comprises a further triggerable voltage determining unit for determining, upon being triggered, a voltage across the further light-emitting element, wherein the triggering unit is adapted to trigger the further triggerable voltage determining unit to determine the voltage across the further light-emitting element after a time period ($\Delta t$) during which the driving current is not provided to the further light-emitting element, wherein the short detection unit is adapted to detect a short in the further light-emitting element based on the determined voltage across the further light-emitting element.

12. The electroluminescent device as defined in claim 1, wherein the short detection circuit further comprises a short protection unit for turning off the electroluminescent device if a short is detected in the light-emitting element.

13. The electroluminescent device as defined in claim 1, wherein the light-emitting element comprises an organic light-emitting diode, wherein the capacitance comprises an internal capacitance of the organic light-emitting diode, or, wherein the light-emitting element comprises a light-emitting diode, wherein the capacitance comprises an external capacitance being connected in parallel to the light-emitting diode.

14. A short detecting method for detecting a short in a light-emitting element having a capacitance, the short detection method being adapted for use in an electroluminescent device comprising the light-emitting element and a switchable current source being connected to the light-emitting element for providing a driving current to the light-emitting element, wherein the short detection method comprises:
triggering a triggerable voltage determining unit to determine a voltage across the light-emitting element after a time period ($\Delta t$) during which the driving current is not provided to the light-emitting element, by a triggering unit,
determining, upon being triggered, the voltage across the light-emitting element, by the triggerable voltage determining unit, and
detecting a short in the light-emitting element based on the determined voltage across the light-emitting element, by a short detection unit.

* * * * *